(12) United States Patent
Eloy

(10) Patent No.: US 9,384,078 B2
(45) Date of Patent: Jul. 5, 2016

(54) METHOD FOR DIAGNOSING A MECHANISM OF UNTIMELY CUT-OFFS OF THE POWER SUPPLY TO A MOTOR VEHICLE COMPUTER

(71) Applicants: CONTINENTAL AUTOMOTIVE FRANCE, Toulouse (FR); CONTINENTAL AUTOMOTIVE GmbH, Hannover (DE)

(72) Inventor: Stephane Eloy, Tournefeuille (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 284 days.

(21) Appl. No.: 13/946,182

(22) Filed: Jul. 19, 2013

(65) Prior Publication Data

US 2014/0025996 A1  Jan. 23, 2014

(30) Foreign Application Priority Data

Jul. 19, 2012  (FR) ...................................... 12 56982

(51) Int. Cl.
   *G06F 11/07* (2006.01)
   *G01R 31/00* (2006.01)
   *G06F 11/14* (2006.01)
   *G01R 31/40* (2014.01)

(52) U.S. Cl.
   CPC ............ *G06F 11/079* (2013.01); *G01R 31/007* (2013.01); *G06F 11/1417* (2013.01); *G01R 31/40* (2013.01)

(58) Field of Classification Search
   CPC ...... G07C 5/008; G07C 5/0808; G07C 5/085; G07C 2205/02
   See application file for complete search history.

(56) References Cited

U.S. PATENT DOCUMENTS

| 5,935,259 | A  | * | 8/1999  | Anderson ........................ 714/22 |
| 7,518,261 | B2 |   | 4/2009  | Sugimura et al. |
| 2011/0199115 | A1 | * | 8/2011  | Iida ........................... 324/764.01 |
| 2011/0258486 | A1 | * | 10/2011 | Bhogal et al. ................... 714/15 |

FOREIGN PATENT DOCUMENTS

DE  10 2004 023084 B3   6/2005

OTHER PUBLICATIONS

French Search Report, dated Apr. 4, 2013, from corresponding French application.

* cited by examiner

*Primary Examiner* — Jigar Patel
(74) *Attorney, Agent, or Firm* — Young & Thompson

(57) ABSTRACT

A method for diagnosing a mechanism of untimely cut-offs of the power supply to a motor vehicle computer (1) which is programmed to execute a startup routine when woken up and a shutdown routine before being put into sleep mode, includes, at the time of each shutdown routine, generating and storing in storage elements a marker representing a completed execution of the shutdown routine, and at the time of each startup routine, checking for the presence of a marker, and if the marker is present, reinitializing the storage elements of the marker, and if the marker is absent, generating a data element representing a power supply fault.

6 Claims, 1 Drawing Sheet

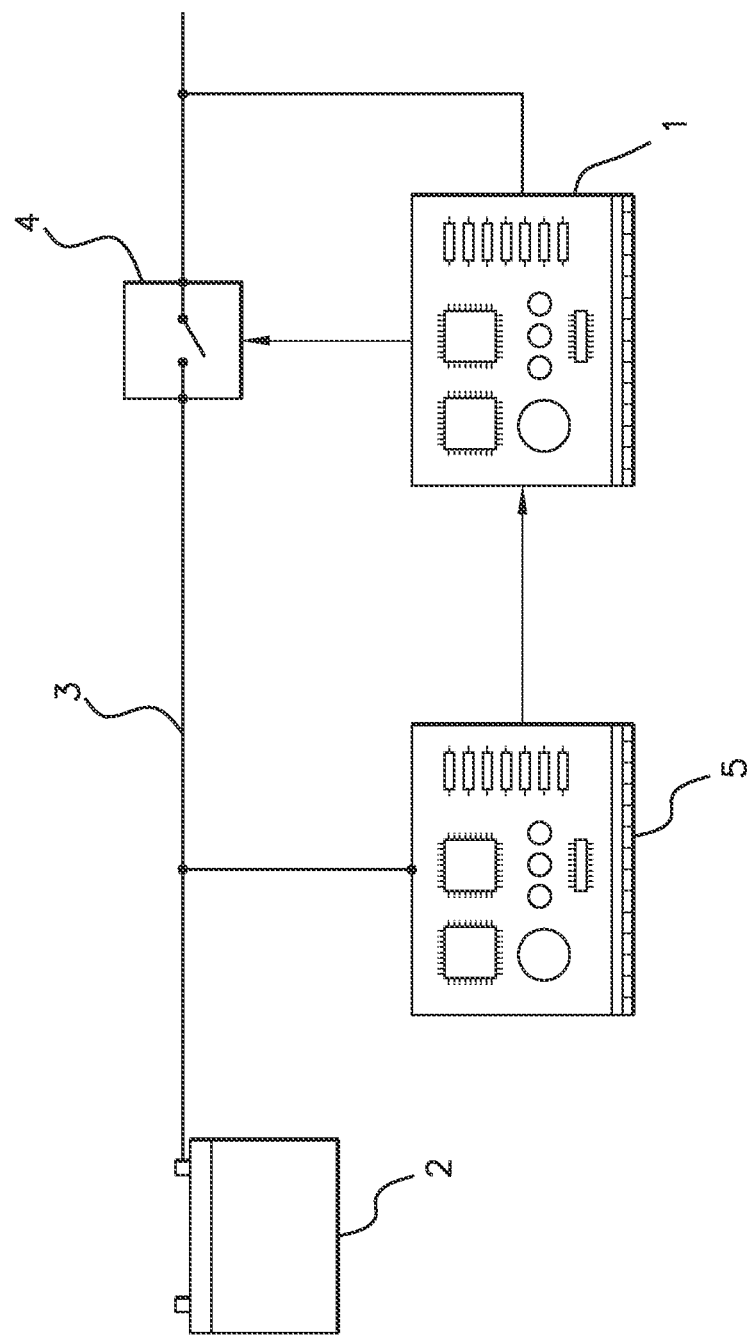

METHOD FOR DIAGNOSING A MECHANISM OF UNTIMELY CUT-OFFS OF THE POWER SUPPLY TO A MOTOR VEHICLE COMPUTER

FIELD OF THE INVENTION

The invention relates to a method for diagnosing a mechanism of untimely cut-offs of the power supply to a motor vehicle computer which is programmed to execute a startup routine when woken up and a shutdown routine before being put into sleep mode.

BACKGROUND OF THE INVENTION

Motor vehicle computers, including, notably, injection computers, are supplied by a battery connected to them by a wiring harness in which a power supply relay may be interposed.

Power supply means of this type may suffer from malfunctions such as poor connection of the battery to the harness, imperfect relay operation, short circuits upstream and/or downstream of the computer, and the like, resulting in computer power supply cut-offs and, consequently, untimely reinitializations of the computer.

At the present time, there is no diagnostic method for targeting this type of malfunction, and therefore the detection of the origin of untimely interruptions of computer operation may be found to give rise to incorrect diagnoses before the true cause of the failure is discovered.

SUMMARY OF THE INVENTION

The present invention is intended to overcome this drawback and has the primary object of providing a diagnostic method for targeting the origin of faults in the operation of a computer when these faults are due to untimely cut-offs of the power supply to said computer.

Another object of the invention is to provide a diagnostic method requiring a simple software implementation.

To this end, the invention proposes a method for diagnosing a mechanism of untimely cut-offs of the power supply to a motor vehicle computer which is programmed to execute a startup routine when woken up and a shutdown routine before being put into sleep mode, said method consisting in the following steps, according to the invention:
  at the time of each shutdown routine, generating and storing in storage means a marker $V_{ext}$ representing a completed execution of said shutdown routine,
  and, at the time of each startup routine, checking for the presence of a marker $V_{ext}$ and:
  if the marker $V_{ext}$ is present, reinitializing the storage means of said marker,
  if the marker $V_{ext}$ is absent, generating a data element representing a power supply fault.

Therefore the effect of the method according to the invention is that, whenever the computer is woken up, a check is made as to whether the preceding shutdown of the computer has been carried out in a normal way, in other words at the end of a regular shutdown routine.

If this is not the case, this method enables the origin of the faulty operation of the computer to be targeted immediately, making it possible to produce a diagnosis that these faults are due to untimely cut-offs of the power supply to said computer originating in a faulty connection of the battery to the harness, imperfect relay operation, or a short circuit upstream and/or downstream of the computer.

It should also be noted that the use of this diagnostic method requires a simple software implementation.

Advantageously, according to the method of the invention, the marker is a specific value $V_{ext}$ assigned to a stored variable V, and at the time of each startup routine, if a marker $V_{ext}$ is present, a value $V_{dém}$ different from that corresponding to said marker $V_{ext}$ is assigned to the stored variable V.

Furthermore, in order to avoid the issue of a data element representing a power supply fault at the time of the first startup routine, the value $V_{dém}$ is advantageously assigned to the variable V stored at the time of this initial startup routine.

Additionally, and advantageously, in order to guard against untimely diagnoses, according to the method of the invention, at the time of each discovery of an absence of the marker $V_{ext}$, a power supply fault counter is incremented, and a diagnosis of real failure is specified for a predetermined value n of said counter.

Moreover, the counter is advantageously reset to zero, according to the method of the invention, if a marker $V_{ext}$ is present at the time of a startup routine. Thus the failure diagnosis is produced only if the absence of the marker $V_{ext}$ is discovered in the course of n successive startup routines.

BRIEF DESCRIPTION OF THE DRAWING

Other features, objects and advantages of the invention will be made clear by the following detailed description with reference to the attached FIG. 1 which represents, by way of non-limiting example, a computer and the power supply means of the computer, which advantageously allow the use of the diagnostic method according to the invention.

DETAILED DESCRIPTION OF THE INVENTION

The invention described below with reference to the attached drawing relates to a method for diagnosing a mechanism of untimely cut-offs of the power supply to a motor vehicle computer 1 which is programmed to execute a startup routine when woken up and a shutdown routine before being put into sleep mode.

This diagnostic method is particularly applicable to a motor vehicle computer 1 such as an injection computer (a term used below for the sake of clarity and simplicity of description), supplied by means of a battery 2 and connected to the latter for this purpose by a wiring harness 3 in which is interposed a relay 4 for cutting off the power supply to said computer.

This injection computer 1 is also connected to a second computer 5, such as the "passenger compartment" computer (a term used for the sake of clarity and simplicity of description), supplied directly by the battery 2, in other words connected to the wiring harness 3 upstream of the relay 4. This passenger compartment computer 5 is adapted in a customary way to control the waking of the injection computer 1.

The method according to the invention for diagnosing a mechanism of untimely cut-offs of the power supply to the injection computer 1 consists, in the first place, at the time of the first startup routine, in assigning a value $V_{dém}$ to a variable V stored in a non-volatile memory. Subsequently, at the time of the first shutdown routine and then at the time of each subsequent shutdown routine, the method according to the invention consists in assigning to this value V, in place of the value $V_{dém}$, a special value $V_{ext}$ consisting in a marker representing the completed execution of said shutdown routine.

This diagnostic method also consists, at the time of each startup routine except for the initial startup routine, in reading the variable V, and:

if this variable V has the value $V_{ext}$, reinitializing it by assigning it the value $V_{dém}$ representing the execution of said startup routine, if this variable V has the value $V_{dém}$ specific to the startup routine and signifying the non-execution of a shutdown routine since the last startup routine, and therefore representing an abnormal stoppage of the computer 1, incrementing a counter recording the number of abnormal stoppages of said computer.

However, this counter is reset to zero if the marker $V_{ext}$ is present at the time of a startup routine.

Finally, if the counter reaches a specified value n, equal to three for example, representing a repetition of faults in the operation of the computer 1 due to untimely cut-offs of the power supply to the latter, a failure diagnosis is produced to enable the origin of the faulty operation of said computer to be targeted. However, it should be noted that this failure diagnosis is produced only if the absence of the marker $V_{ext}$ is discovered during n successive startup routines.

The method according to the invention therefore makes it possible, by means of a simple software implementation, to diagnose the mechanism of untimely cut-offs of the power supply to a computer 1, such as the injection computer, of a motor vehicle.

The invention claimed is:

1. A method for diagnosing a mechanism of untimely cut-offs of the power supply to a motor vehicle computer (1) which is programmed to execute a startup routine when woken up and a shutdown routine before being put into sleep mode, the method comprising:

at the time of each shutdown routine, generating and storing in storage means a marker $V_{ext}$ representing a completed execution of said shutdown routine, and at the time of each startup routine, checking for the presence of a marker $V_{ext}$ and:

when the marker $V_{ext}$ is present, reinitializing the storage means of said marker, and when the marker $V_{ext}$ is absent, generating a data element representing a power supply fault, wherein, in the absence of the marker $V_{ext}$ at the time of a startup routine, a power supply fault counter is incremented, and a diagnosis of real failure is specified for a predetermined value n of said counter.

2. The diagnostic method according to claim 1, wherein the counter is reset to zero when a marker $V_{ext}$ is present at the time of a startup routine.

3. A method for diagnosing a mechanism of untimely cut-offs of the power supply to a motor vehicle computer (1) which is programmed to execute a startup routine when woken up and a shutdown routine before being put into sleep mode, the method comprising:

at the time of each shutdown routine, generating and storing in storage means a marker $V_{ext}$ representing a completed execution of said shutdown routine; and at the time of each startup routine, checking for the presence of a marker $V_{ext}$, and i) when the marker $V_{ext}$ is present, reinitializing the storage means of said marker, and ii) when the marker $V_{ext}$ is absent, generating a data element representing a power supply fault, wherein, the marker is a specific value $V_{ext}$ assigned to a stored variable V, at the time of each startup routine, when a marker $V_{ext}$ is present, a value $V_{dém}$ different from that corresponding to said marker $V_{ext}$ is assigned to the stored variable V, and in the absence of the marker $V_{ext}$ at the time of a startup routine, a power supply fault counter is incremented, and a diagnosis of real failure is specified for a predetermined value n of said counter.

4. The diagnostic method according to claim 3, wherein the counter is reset to zero when a marker $V_{ext}$ is present at the time of a startup routine.

5. A method for diagnosing a mechanism of untimely cut-offs of the power supply to a motor vehicle computer (1) which is programmed to execute a startup routine when woken up and a shutdown routine before being put into sleep mode, the method comprising:

at the time of each shutdown routine, generating and storing in storage means a marker $V_{ext}$ representing a completed execution of said shutdown routine; and at the time of each startup routine, checking for the presence of a marker $V_{ext}$, and i) when the marker $V_{ext}$ is present, reinitializing the storage means of said marker, and ii) when the marker $V_{ext}$ is absent, generating a data element representing a power supply fault, wherein, the marker is a specific value $V_{ext}$ assigned to a stored variable V, at the time of each startup routine, when a marker $V_{ext}$ is present, a value $V_{dém}$ different from that corresponding to said marker $V_{ext}$ is assigned to the stored variable V, at the time of the first startup routine, the value Vdém is assigned to the stored variable V, and in the absence of the marker $V_{ext}$ at the time of a startup routine, a power supply fault counter is incremented, and a diagnosis of real failure is specified for a predetermined value n of said counter.

6. The diagnostic method according to claim 5, wherein the counter is reset to zero when a marker $V_{ext}$ is present at the time of a startup routine.

* * * * *